(12) United States Patent
Maheshwari et al.

(10) Patent No.: US 7,131,078 B1
(45) Date of Patent: Oct. 31, 2006

(54) METHOD AND APPARATUS FOR CIRCUIT DESIGN AND SYNTHESIS

(75) Inventors: Naresh Maheshwari, San Jose, CA (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 259 days.

(21) Appl. No.: 10/646,657

(22) Filed: Aug. 21, 2003

(51) Int. Cl.
*G06F 17/50* (2006.01)

(52) U.S. Cl. ............................................ 716/3; 716/3
(58) Field of Classification Search ................ 716/1–7, 716/16–18
See application file for complete search history.

(56) References Cited

U.S. PATENT DOCUMENTS

| | | | |
|---|---|---|---|
| 5,798,935 A * | 8/1998 | Doreswamy et al. | 716/6 |
| 5,862,149 A * | 1/1999 | Carpenter et al. | 714/726 |
| 6,356,861 B1 * | 3/2002 | Singhal et al. | 703/2 |
| 6,519,754 B1 * | 2/2003 | McElvain et al. | 716/18 |
| 6,523,155 B1 * | 2/2003 | Ruedinger | 716/7 |
| 6,668,364 B1 * | 12/2003 | McElvain et al. | 716/7 |
| 6,751,690 B1 * | 6/2004 | Swanson | 710/72 |
| 6,931,513 B1 * | 8/2005 | Swanson | 712/32 |

OTHER PUBLICATIONS

Sequence Design, Inc., "Power Theater", 2002.
Sequence Design, Inc., "Power Theater Analyst: Power Analysis for SOC Design", 2003.
Synposys, Inc. "PrimePower Datasheet: Dynamic power analysis for multimillion-gate ASICS", Jan. 18, 2002.

* cited by examiner

*Primary Examiner*—Thuan Do
*Assistant Examiner*—Binh Tat
(74) *Attorney, Agent, or Firm*—Blakely, Sokoloff, Taylor & Zafman LLP

(57) ABSTRACT

Methods and apparatuses to maintain and propagate statistical data during circuit synthesis. At least one embodiment of the present invention maintains and propagates statistical data during and after circuit synthesis transformation operations. In one example, the signal switching activity is calculated once at the RTL level and then propagated and/or maintained at various nodes of the circuit through the process of logic synthesis. Thus, the statistical analysis of entire circuit during or after the logic synthesis is avoided. In one example, power optimization is performed during logic synthesis. A portion of the logic synthesis transformation is driven by the power consumption optimization; and, the statistical data about circuit activity maintained at the nodes of the circuit during the synthesis process is used to calculate the power consumption at various points in the process of synthesis transformation.

45 Claims, 10 Drawing Sheets

METHOD AND APPARATUS FOR CIRCUIT DESIGN AND SYNTHESIS

FIELD OF THE INVENTION

The invention relates to circuit design, and more particularly to the synthesis, transform and analysis of logic circuit.

BACKGROUND

For the design of digital circuits (e.g., on the scale of Very Large Scale Integration (VLSI) technology), designers often employ computer aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

Typically, a synthesis software program is used to map a RTL design into a technology specific gate level design. During the logic synthesis, the logic circuit design is heavily transformed (e.g., through operations such as logic transformation, register replication, finite state machine implementation, pushing a register through a logic element, retiming). The resulting gate level design typically has much more elements than the original RTL design has; and, the gate level design typically includes types of elements that are different from those in the original RTL design.

A number of methods have been used to obtain statistical data about circuit activity for a given circuit design. For example, when a set of test vectors is applied to a circuit design, a simulation software program can be used to exercise the circuit to obtain statistical data, such as the probability of signal switching at a point in the circuit, which can be used in the estimation of the power consumption of the circuit. The input for the circuit may also be generated randomly (e.g., using a Monte Carlo method) to exercise the circuit. Alternatively, when statistical input data for the circuit is available, formal Boolean analysis based methods can be used to determine the corresponding statistical data about the circuit activities in the circuit.

The traditional statistical analysis to obtain the circuit activity data in the circuit is a time consuming operation. It is especially time consuming for a circuit design that involves a large number of elements (e.g., the gate level design of a digital circuit).

SUMMARY OF THE DESCRIPTION

Methods and apparatuses to maintain and propagate statistical data during circuit synthesis are described here. Some embodiments of the present inventions are summarized in this section.

At least one embodiment of the present invention maintains and propagates statistical data during and after circuit synthesis transformation operations. In one example, the signal switching activity is calculated once at the RTL level or behavioral level and then propagated and/or maintained at various nodes of the circuit through the process of behavioral and logic synthesis. Thus, the statistical analysis of entire circuit during or after the synthesis is avoided. In one example, power optimization is performed during synthesis. A portion of the synthesis transformation is driven by the power consumption optimization; and, the statistical data about circuit activity maintained at the nodes of the circuit during the synthesis process is used to calculate the power consumption at various points in the process of synthesis transformation.

In one aspect of the invention, a method to design a circuit includes: determining first statistical circuit activity data at a plurality of nodes of a first design of the circuit; transforming a first portion of the first design to generate a second portion of a second design of the circuit; selectively determining at least one node in the second portion of the second design; and determining second statistical circuit activity data for the at least one node in the second portion of the second design from the first statistical circuit activity data. In one example, the first portion of the first design includes at least one of the plurality of the nodes of the first design. In one example, the second statistical circuit activity data includes: a) probability information of state transition at a node; b) probability information of the node being at a state; and c) probability information of a group of nodes being at a state. In one example, a subset of nodes of the plurality of nodes of the first design remain unchanged in the second design after the first portion of the first design is transformed; and, a portion of the first statistical circuit activity data is maintained for the subset of nodes in the second design. In one example, a third portion of the second design is further transformed to generate a fourth portion of a third design of the circuit; at least one node in the fourth portion of the third design is then selectively determined; and third statistical circuit activity data for the at least one node in the fourth portion of the third design is determined from a portion of: a) the first statistical circuit activity data; and b) the second statistical circuit activity data. In one example, one or more signals at the at least one node in the second portion of the second design drive the third portion of the second design. In one example, the second statistical circuit activity data is determined from a formal Boolean analysis; and, the first design is one of: a) a register transfer level (RTL) design, and b) a behavioral level design; and, the first portion of the first design is transformed to generate a gate level design. In one example, the plurality of nodes of the first design are selectively determined; and, the first statistical circuit activity data is obtained from a statistical analysis (e.g., a simulation based on a set of test vectors, a simulation based on random input, a formal analysis based on a specification of statistical input data) based on the first design. In one example, the plurality of nodes include at least one of: a) a register; b) a finite state machine; c) a counter; d) a random access memory (RAM); e) a set of registers with state constraints; and f) a persistent node (e.g., an output node of a multiplier, which will often persist during transformation). In one example, state correlation information among the plurality of nodes of the first design is determined; and the second statistical circuit activity data is further determined from the state correlation information. In one example, the transformation includes one of: a) replicating a register; b) pushing a register through a logic element; c) changing encoding of a finite state machine; d) retiming; and e) changing encoding of a group of nodes; and, at least one node in the second portion of the second design includes a register of the second portion of the second design. In one example, it is further determined the state correlation information among the at least one node in the second portion of the second design and a subset of nodes of the plurality of nodes of the first design that remain unchanged in the second design after the first portion of the first design is transformed.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
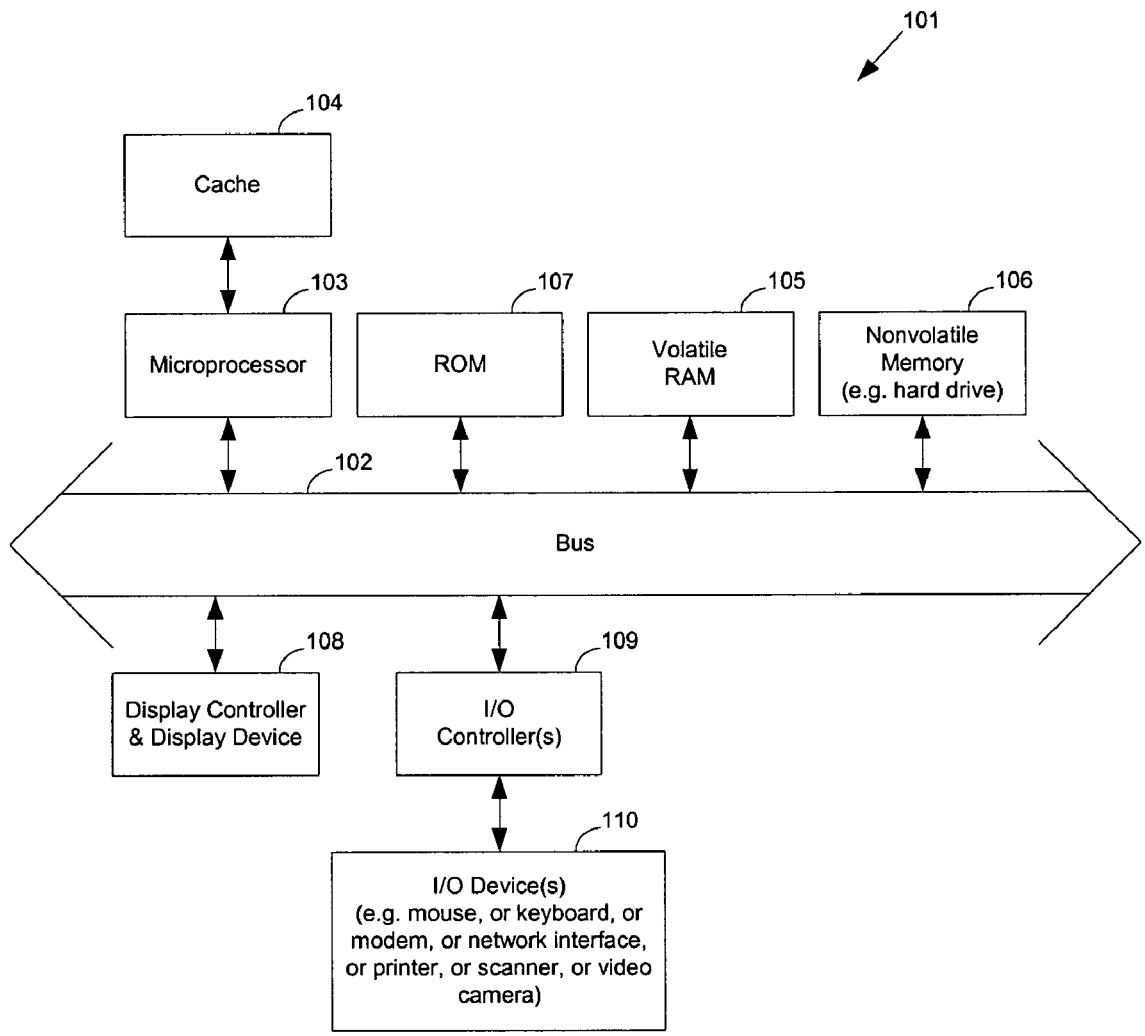
FIG. 1 shows a block diagram example of a data processing system which may be used with the present invention.

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessary to the same embodiment; and, such references mean at least one.

At least one embodiment of the present invention seeks to maintain and propagate statistical data during and after circuit synthesis transformation operations.

Statistical data about circuit activity, such as the probability of signal switching, can be used for various operations for the design and the test of the circuit. For example, the average dynamic power consumption on a given node can be estimated from the probability of signal switching at the node using the following formula.

$$P_{avg} = 0.5 \times V^2 \times C \times P_s f$$

V is the supply voltage; C is the load capacitance of the node under consideration; $P_s$ is the probability of signal switching at the node; and, f is the frequency of the clock under which the node is operating. The average power consumption of a circuit is the sum of the average power consumptions of all the nodes in the circuit.

In one embodiment of the present invention, power optimization is performed during logic synthesis, physical synthesis, and placement and routing. A portion of the logic synthesis transformation is driven by the power consumption optimization. Thus, the statistical data about circuit activity is used to calculate the power consumption at various points in the process of synthesis transformation. Supply voltage, clock frequency and capacitance on any node can be calculated from the design representation and the information from a library using various methods known in the art. However, performing a statistical analysis for the entire circuit after each transformation to calculate the power consumption would be too time consuming. It is not practical to perform traditional statistical analyses of the circuit at various points in the process of synthesis transformation for the power consumption optimization.

In one embodiment of the present invention, the switching activity is calculated once at the RTL level (or behavioral level) and then propagated and/or maintained at various nodes of the circuit through the process of logic synthesis (or behavioral synthesis). Thus, the statistical analysis of entire circuit during or after the logic synthesis or other transforms is avoided.

In one embodiment of the present invention, a statistical analysis is performed for a register transfer level (RTL)

design to obtain circuit activity statistical data at various points of the RTL design. The RTL design is transformed from a RTL description into a gate level representation through the process of logic synthesis transformations. The design goes through many transformations in the synthesis process. After each step of synthesis transformation, the statistical data (e.g., data about switching activity) at a node that is affected by the transformation is selectively recalculated from the statistical data maintained at a number of nodes of the design that is before the step of the transformation so that the statistical data can be propagated (and/or maintained) at some of the nodes of the circuit during the process of synthesis transformations. Since many synthesis transformations introduce new nodes (and/or replace elements), new nodes may be selectively determined to maintain and propagate the statistical data; and, statistical data maintained on some of the nodes may be selectively discarded after a transformation. More details will be illustrated with examples discussed below.

Many of the methods of the present invention may be performed with a digital processing system, such as a conventional, general-purpose computer system. Special purpose computers, which are designed or programmed to perform only one function, may also be used.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be a Sun workstation, or a personal computer (PC) running a Windows operating system, or an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103 is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

In one embodiment of the present invention, statistical circuit activity data (e.g., signal switching activity) is obtained at some nodes from a statistical analysis of a high level design (e.g., a RTL or behavioral level design), which typically has a much smaller number of elements than a lower level design (e.g., a gate level design) that is obtained from the high level design after synthesis transformations. Calculating switching activity typically requires some forms of simulation to exercise the circuit with various internal states and external inputs. Many methods known in the art can be used to obtain the switching activity statistics of a RTL design. For example, switching activity data of a RTL design may be obtained through an explicit simulation or an implicit simulation. In an explicit simulation, the RTL design is simulated with a large set of user supplied test vectors. These test vectors represent the typical environment in which the design is expected to work. Signal transitions at nodes of interest are tracked during the simulation to obtain the statistical data about the switching activity. Sometimes the large set of input test vectors are not available; and, an implicit simulation may be used. In an implicit simulation, the input for the circuit is generated (e.g., randomly using a Monte Carlo method) during the simulation to obtain the statistical data about the switching activity. For example, design characteristics can be used to force the circuit into various internal states; and, then random input values are used for an implicit simulation. Alternatively, when the statistical data about the input values are known (or assumed to be random), Boolean analysis based methods can be used to determine the corresponding statistical data of the nodes in the circuit.

Figure 2:
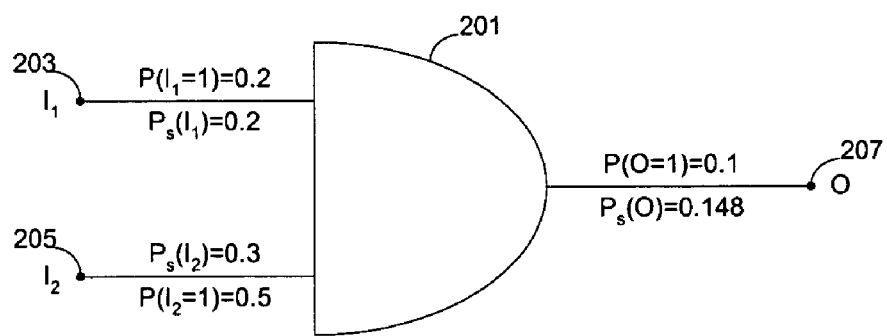
FIG. 2 shows an example method of using a formal Boolean analysis to determine statistical data about circuit activity, which may be used with the present invention.

FIG. 2 shows an example method of using a formal Boolean analysis to determine statistical data about circuit activity, which may be used with the present invention. In FIG. 2, when the statistical data about nodes $I_1$ (203) and $I_2$ (205) is known, the statistical data about node 207 is determined from a formal Boolean analysis of logic circuit 201. For example, in FIG. 2, the probability of node $I_1$ being 1 is $P(I_1=1)=0.2$; the probability of node $I_2$ being 1 is $P(I_2=1)=0.5$; the probability of signal switching at node $I_1$ is $P_s(I_1)=0.2$; and the probability of signal switching at node $I_2$ is $P_s(I_2)=0.3$. Thus, the probability of node $I_1$ being 0 is $P(I_1=0)=1-P(I_1=1)=0.8$; the probability of node $I_2$ being 0 is $P(I_2=0)=0.5$; the probability of no signal switching at node $I_1$ is $P_n(I_1)=1-P_s(I_1)=0.8$; and the probability of no signal switching at node $I_2$ is $P_n(I_2)=0.7$. In FIG. 2, the signals of nodes $I_1$ and $I_2$ are assumed to be independent from each other. However, since logic element 201 is an AND gate, the state of node O (207) is completely determined from the states of nodes $I_1$ and $I_2$ (203 and 205). Thus, the probability of the system being in a state such that $I_1$ is x and $I_2$ is y is $P(I_1=x, I_2=y)=P(I_1=x) \times P(I_2=y)$, where $x=0,1$; $y=0,1$. Thus, the probability of node O (207) being (x & y) where $I_1=x$ and $I_2=y$ is $P(I_1=x) \times P(I_2=y)$. In general, the probabilities of node O (207) being 1 can be determined for various combinations of x and y for nodes $I_1$ and $I_2$ from a Boolean analysis; and, the sum of these probabilities is the probability of node O being 1. For example, from a Boolean analysis, all possible states of the circuit are listed in table 211 in FIG. 2. For instance, when the system is in state 2, row 215 shows that node $I_1$ (211) is 0, node $I_2$ (205) is 1, and node O (206) is 0. The probability of the system being in one of the state is product of the probabilities of the corresponding input nodes being in the corresponding states. In FIG. 2, it is seen (e.g., from table 211) that node O is 1 only if $I_1=1$ and $I_2=1$; thus, $P(O=1)=P(I_1=1) \times P(I_2=1)=0.1$. Similarly, the probability of the system switching from a first state to a second state is the product of the probabilities of the system being in the first state and the probabilities of signal transition for the individual input nodes so that the system transits from the first state to the second state. For example, the probability of the system to switch from a state of $I_1=x$ and $I_2=y$ to a state of $I_1=x$ and $I_2=1-y$ is $P(I_1=x) \times P(I_2=y) \times P_n(I_1) \times P_s(I_2)$; to a state of $I_1=1-x$ and $I_2=y$ is $P(I_2=x) \times P(I_2=y) \times P_s(I_1) \times P_n(I_2)$; to a state of $I_1=1-x$ and $I_2=1-y$ is $P(I_1=x) \times P(I_2=y) \times P_s(I_1) \times P_s(I_2)$. Thus, the probability of signal switch at node O is the sum of the probabilities of the system switching from one set of input to another that causes a state change at node O. From a Boolean analysis, all possible state switching of the circuit are listed in table 213 in FIG. 2. For example, when the system transits from state 1 to state 3, row 217 shows that there is no switching in nodes $I_2$ and O and the signal switches at node $I_1$. In FIG. 2, it is seen that the signal at node O changes when: 1) $I_1=1$ and $I_2=1$ change to $I_1=0$ and $I_2=1$, which has a probability of $P(I_1=1) \times P(I_2=1) \times P_s(I_1) \times P_n(I_2)=0.014$; 2) $I_1=1$ and $I_2=1$ change to $I_1=1$ and $I_2=0$, which has a probability of $P(I_1=1) \times P(I_2=1) \times P_n(I_1) \times P_s(I_2)=0.024$; 3) $I_1=1$ and $I_2=1$ change to $I_1=0$ and $I_2=0$, which has a probability of $P(I_1=1) \times P(I_2=1) \times P_s(I_1) \times P_s(I_2)=0.006$; 4) $I_1=0$ and $I_2=1$ change to $I_1=1$ and $I_2=1$, which has a probability of $P(I_1=0) \times P(I_2=1) \times P_s(I_1) \times P_n(I_2)=0.056$; 5) $I_1=1$ and $I_2=0$ change to $I_1=1$ and $I_2=1$, which has a probability of $P(I_1=1) \times P(I_2=0) \times P_n(I_1) \times P_s(I_2)=0.024$; and 6) $I_1=0$ and $I_2=0$ change to $I_1=1$ and $I_2=1$, which has a probability of $P(I_1=0) \times P(I_2=0) \times P_s(I_1) \times P_s(I_2)=0.024$. Thus, the probability of signal switching at node O (207) is 0.148, the sum of the probabilities of these individual cases.

Although the above example is illustrated with an AND gate, a person skilled in the art understands that in general the method of formal Boolean analysis can be used for propagating statistical data across any logic circuit.

In one embodiment of the present invention, a statistical analysis is performed for a RTL or behavioral level design, which is relative small when compared to a gate level design obtained after logic synthesis or behavioral synthesis. The statistical data are maintained and propagated through the synthesis process so that the statistical data is available during and after the synthesis process, without having to perform a traditional full scale statistical analysis for the entire design (during or after the synthesis).

For example, after a statistical analysis, switching information at the RTL level at every register, I/O, black box boundary and persistent nodes are collected (or generated). A persistent node is a node that typically persists during the synthesis process. For example, the output node of a multiplier will often persist. The switching information includes: a) the probability of the node being in a state (e.g., 1 or 0); b) the probability of the signal switching at the node (e.g. for every clock cycle); and, c) probability information of a group of nodes being at a state. For example, after an HDL design is compiled with sequential optimizations disabled, a simulator is controlled (e.g., through a programming language interface (PLI) or a script) to record the switching information at every node of interest (e.g., the registers, memory elements, flip-flops, black box boundary points). Alternatively, the simulator may record the waveform on every node of interest, which is then converted into switching activity. Note that the simulator may record more information than needed; and then, a filter is used to generate the switching information for the nodes of interest (e.g., registers).

In one embodiment of the present invention, after a statistical analysis is performed for a RTL design, the statistical data is selectively maintained for a number of nodes on the circuit. For example, the statistical data for the sequential elements (e.g., registers, memory elements, flip-flops) of the circuit is maintained. During the logic synthesis process, the combinational logic is heavily transformed, while the sequential logic is relatively stable.

In one embodiment of the present invention, the statistical data is maintained on the sequential elements during the logic synthesis operations. For example, the switching information is maintained at all sequential elements at all times. This is achieved by updating the switching activity when the sequential transformation is applied and by tracking enough information about the sequential transformation so that the switching activity can be updated after the transform has been applied. When a transformation does not involve a sequential element, the statistic data for the sequential element does not change. When a transformation involves a sequential element (e.g., in a register replication operation, in an operation to pushing a register through a logic element (retiming operation for clock minimization or register reduction) in an operation of implementing a finite state machine or changing the encoding of a finite state machine), statistical data of the sequential elements affected by the transformation is re-evaluated to reflect the changes made by the transformation. A Boolean analysis based method is used to determine the changes in the statistical data for the sequential elements affected by the transformation. However, other methods, such as a Monte Carlo method can be used (e.g., when the transformation is very complicated). In general, a logic synthesis transformation involves only a small portion of the circuit; and, the update of the statistical data for the sequential elements can be performed very efficiently (e.g., using a Boolean analysis based method). When switching information during (or after) logic synthesis is needed (e.g., for the estimation of power consumption), the switching information for the logic elements is derived from the switching information maintained for the sequential elements (or the persistent nodes). For example, the switching activity maintained at every sequential element (and primary inputs of the circuit) can be used to re-compute the switching activity at any node in the combinational logic, for example, using a Boolean decision diagram (BDD) based technique which uses simplification of the Boolean relationships between the nodes and the fanin registers. It is understood that since the statistical data is available at the sequential elements of the transformed design, the activities for the logic elements can be efficiently determined from neighboring sequential elements (e.g., using a Boolean analysis based method, or alternatively, a simulation based method). Thus, the sequential elements effectively partition the entire circuit into small blocks for the purpose of evaluating the statistical data for the transformed design (e.g., the gate level design transformed from the RTL design).

It is understood that, in general, a set of nodes (e.g., sequential elements) selected from a circuit for maintaining the statistical data during the synthesis process have interdependency. The states of the set of nodes are determined by the states of the input nodes and are not completely independent from each other. However, to determine the circuit activity statistics at any point in the circuit, the statistical data of only a small number of nodes near the point is used. Thus, only the correlation information for the small number of nodes is necessary for the accurate determination (propagation) of the statistical data from these nodes to the point in the circuit. For example, in FIG. 2, only nodes $I_1$ (203) and $I_2$ (205) are required to determined the state of node O (207); and, a correlation group of nodes $I_1$ (203) and $I_2$ (205) can be maintained for propagating the statistical data to node O (207). In one embodiment of the present invention, to track the correlation information for the group of the small number of nodes, the probabilities of the group of nodes in various states are maintained, from which the probabilities of the nodes in the group in various states can also be determined. Such information about a correlation group is maintained during the synthesis transformation so that points in the circuit determined by the state of the group of nodes can be accurately determined. A group has a sparse range when the number of achievable states of the group is much smaller than the number of possible states if the nodes are considered independent from each other. The states of the nodes of a sparse group have strong correlation. In one embodiment of the present invention, correlation groups of nodes are determined according to the need to propagate the statistical data from these nodes into various points in the circuit. To trade off between efficiency and accuracy, in one embodiment of the present invention, the correlation information is maintained only for the sparse groups. The states of the nodes in a weak correlation group are assumed to be independent from each other. During the process of synthesis transformation, new correlation groups may be created (e.g., when a register replication operation is performed); existing correlation groups may be eliminated (e.g., when the group is no longer required for the propagation of statistical data) or be replaced (e.g., when a number of additional nodes are added so that the nodes are regrouped for the purpose of statistical data propagation).

When a node (e.g., a register) is replicated into many corresponding nodes (e.g., registers), all replicates inherit the same switching information of the original. The correlation between the signals of the replicates is tracked. When two registers are merged, the switching information on the resulting register can be calculated from the switching information for the original registers and the correlation between them. For example, when two registers for a same signal are merged, the switching information for the two registers should be the same, which is to be inherited by the resulting register. However, accumulated errors may cause the differences in the switching information for the original registers, in which case an algorithm may be used to determine the switching information for the resulting register from the switching information of the original registers (e.g., through an averaging process).

Figure 3:
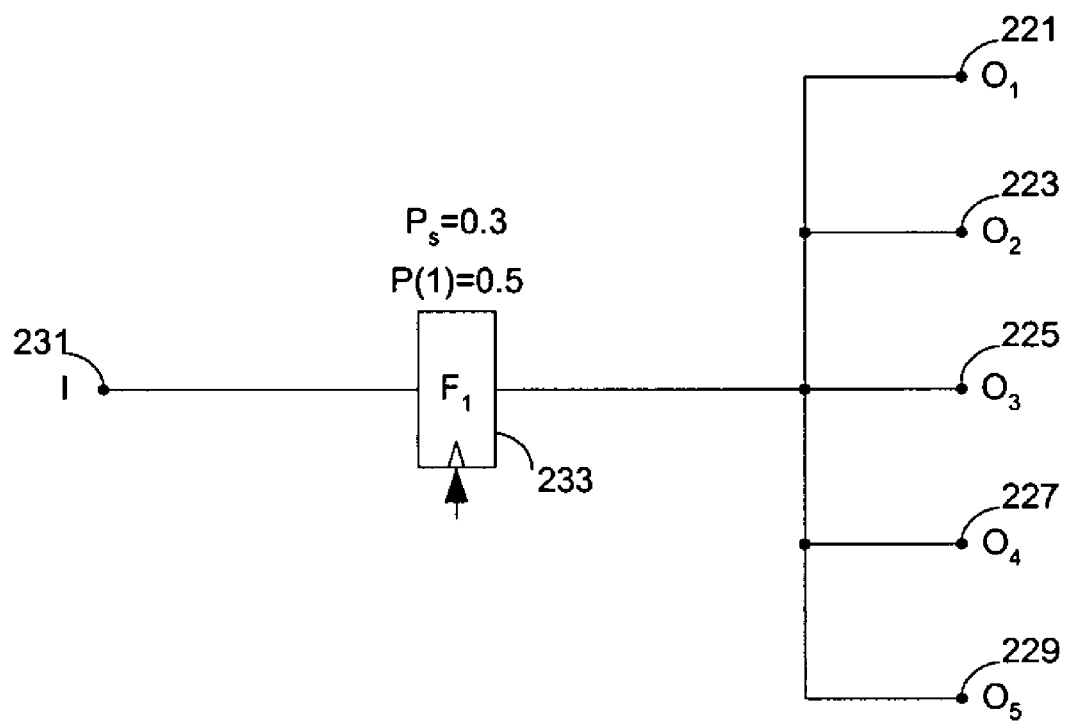
FIGS. 3 and 4 illustrate an example of propagating statistical data after a register replication operation during logic synthesis according to one embodiment of the present invention.
Figure 4:
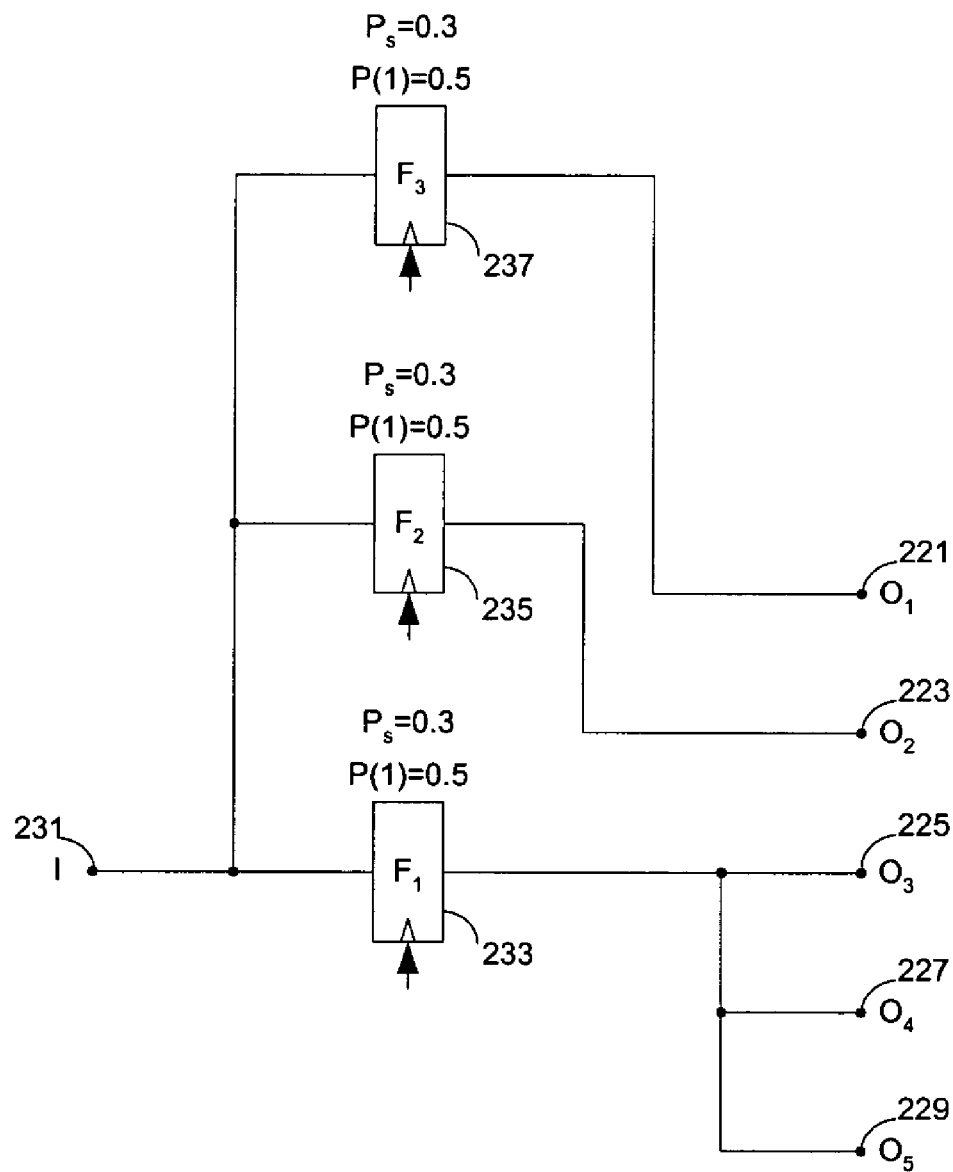

FIGS. 3 and 4 illustrate an example of propagating statistical data after a register replication operation during logic synthesis according to one embodiment of the present invention. In FIG. 3, the output signal of register 233 drives nodes 221–229. During a logic synthesis operation, it may be determined that register 233 is to be replicated for driving nodes 221 and 223 separately to generate the circuit in FIG. 4. In FIG. 4, register 233 drives nodes 225–229; and, registers 235 and 237 drive nodes 221 and 223 respectively. Since the transformation does not change the signal for register 233, the statistical data maintained for register 233 does not change. Further, since new registers 235 and 237 are introduced by the transformation, the statistical data is also determined for registers 235 and 237. Since the registers 233–237 in FIG. 4 have the same signal, the statistical data for register 233 is also replicated for registers 235 and 237. Further, the signal states of registers 233–237 are strongly correlated. In FIG. 4, the signal states of registers are the same. Such correlation information is maintained for the determination of the statistical data for the logic elements that combines the signals from these registers. For example, a correlation group of registers 233–235 is created. Since the correlation is strong and the group has a sparse range, the probabilities of the group in achievable states are maintained, from which the probabilities of a node of the group in a state can be determined (e.g., summing the probabilities of the group in achievable states in which the node is 1).

In one embodiment of the present invention, the statistical data is not necessary maintained on sequential elements during the logical synthesis operation. For example, the statistical data and correlation information for registers 233–237 in FIG. 4 can also be maintained on node 231, which may be an output of a logic element (e.g., a multiplier). Certain logic elements (e.g., a multiplier) involve complicated Boolean operations; and, it may be time consuming to propagate the statistical data across such logic elements. Thus, the statistical data for the output of these complex logic elements can also be selected as nodes for maintaining statistical data during logic synthesis.

In many cases, the input signals to a circuit are considered independent from each other. Since the states of the interior nodes of the circuit (e.g., the sequential elements selected for maintaining the statistical data) are in general completely determined from the inputs, the states of these interior nodes in general have inter-dependency. When the combination of the signals from these interior nodes are determined through logic elements, the assumption of that the signals at theses interior nodes are independent from each other will introduce errors in propagating the statistical data from these interior nodes to a logic element. Although it is possible to track the correlation information for all the correlated nodes (e.g., in terms of the probability of a node being 1 when the states of related nodes are in a given state), tracking and using all the correlation information can lead to the extensive use of memory and computation time. Thus, in one embodiment of the present invention, to achieve the tradeoff between accuracy and efficiency, only relations for strongly correlated signals are tracked; and, other signals are assumed to be independent from each other. For example, groups of nodes (e.g., registers 233–237 in FIG. 4) with strong correlation are determined; and, the probabilities of a group being in various particular states (e.g., the probability distribution of the group as a multivalued circuit node) are determined and maintained. When a set of nodes that all are required to propagate the statistical data to a point in the circuit have a sparse range, the correlation information for the set of nodes is maintained. In one embodiment of the present invention, the probabilities of a correlation group being in all achievable states are maintained, from which the probability of a member of the group being a given state can be determined through a sum of the probabilities of the group being in states where the member is of the given state. During the synthesis process, when a node of a correlation group is involved in a transformation, the correlation information for the group is also updated (e.g., through updating the achievable states of the groups and corresponding probabilities).

In one embodiment of the present invention, the statistical data for the circuit is also maintained for some high level structures of the circuit, such as a finite state machine (FSM), a random access memory (RAM), and a counter. These high level structures can be considered as correlation groups, for which the probabilities for each group in all achievable state in the circuit are maintained. Note that a collection of nodes in the circuit can be treated as a single multivalued circuit node (or a correlation group). For example, an N state FSM can be treated as a single node with N possible states. This allows encoding transformation for the multivalued circuit node, in which the collection of nodes for the multivalued circuit node in the original circuit is transformed into another collection of nodes in the transformed circuit. Thus, the operations on a collection of nodes can be considered as operations on a corresponding multivalued circuit node. It is understood that, in this description, a node can have more than two states; a node is not necessary a Boolean node. When a node is Boolean, it is necessary to maintain the probability of the node being in one of the two states, since the probability of the node being the other state can be determined from the probability that is maintained. When a node is multivalued node (e.g., a node of more than two states), the probability distribution of the nodes being in various different states is maintained. For example, for an N state node, the probabilities of the node being in N−1 (or N) states are maintained. Although some examples of the present invention are illustrated using a Boolean node, from this description, it will be apparent to one skilled in the art that the methods can also be applied to multivalued nodes in general. During the synthesis process, the encoding for these high level structures may be changed; and, these high level structures are implemented using low level elements. Similar to the transformations made to a correlation group, after the transformations to these high level structures, the corresponding statistical data (including the correlation information) is also updated. For example, when the encoding of a finite state machine is changed, the statistical data for the corresponding nodes of the finite state machine are determined from the probabilities of the finite state machine in various achievable states. When the finite state machine is implemented with low level elements, additional nodes in the finite state machine may be selected to maintain the statistical data; and the original correlation group for the finite state machine may be broken into a number of correlation groups. When the finite state machine is transformed into another implementation (or encoding), the corresponding nodes for the finite state machine may become sparse, in which case a correlation group is used to track the correlation information. For example, when a finite state machine is implemented using a particular encoding, the switching information on any register bit can be computed as the sum of the probability of all state transition in which this register changes value. The probability of the register being 1 is simply the sum of probability of all states where this register as 1 in the particular encoding.

Figure 5:
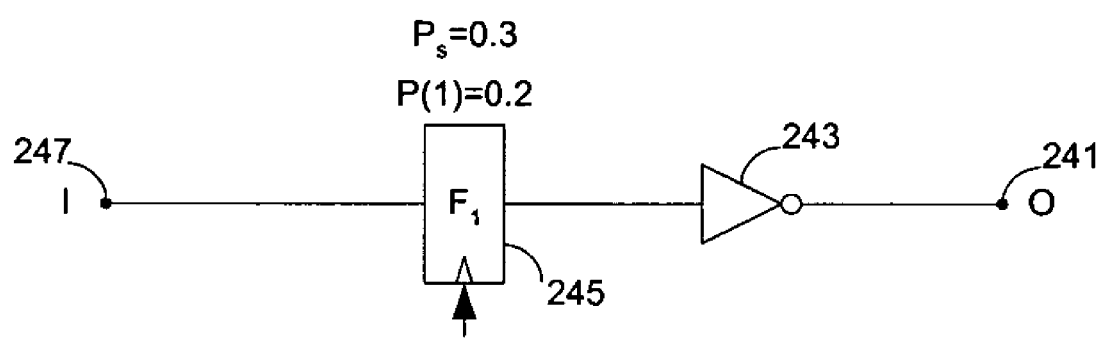
FIGS. 5 and 6 illustrate an example of propagating statistical data after pushing a register through a logic element during logic synthesis according to one embodiment of the present invention.
Figure 6:
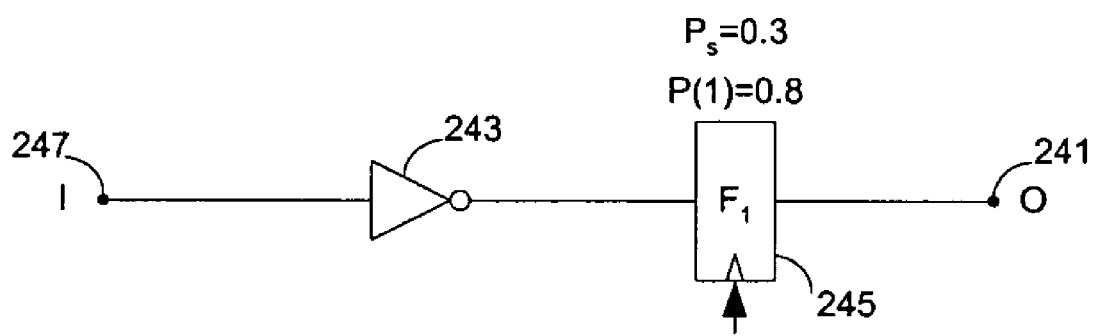

FIGS. 5 and 6 illustrate an example of propagating statistical data after pushing a register through a logic element during logic synthesis according to one embodiment of the present invention. In FIG. 5, register 245 drives inverter 243. During the logic synthesis, the register may be pushed through the inverter to generate the circuit in FIG. 6, in which the inverter drives the register. From the logic of the inverter, it is determined that probability of signal switching at the register does not change after the transformation; and, the probability of being 1 at register 245 in FIG. 5 becomes the probability of being 0 at register 245 in FIG. 6. Thus, the statistical data for register 245 in FIG. 6 (after the transformation) can be determined from the Boolean logic of inverter 243 and the statistical data for register 245 in FIG. 5 (before the transformation). Similarly, when the register is pushed backward through an inverter (e.g., a transform from the circuit in FIG. 6 to the circuit in FIG. 5), the statistical data for the register can also be updated accordingly.

When registers are repositioned (e.g., after a retiming operation) through a combination logic, the switching activity of the new registers inserted at the new locations in the retiming operation is the switching information as computed from the switching information maintained at neighboring nodes at the corresponding locations in the original circuit (the circuit before the transformation).

Figure 7:
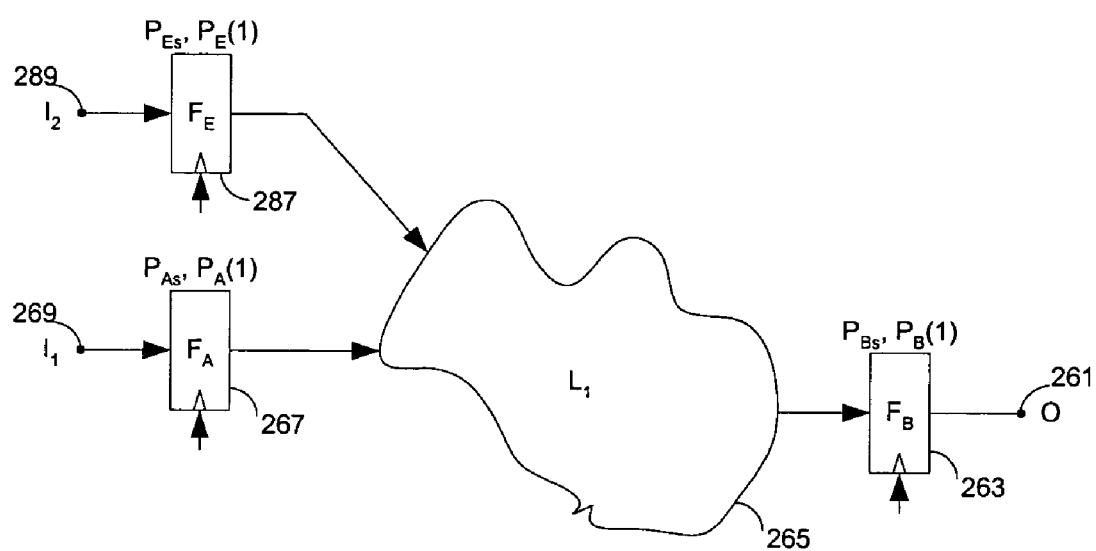
FIGS. 7 and 8 illustrate an example of propagating statistical data after a retiming operation during logic synthesis according to one embodiment of the present invention.
Figure 8:
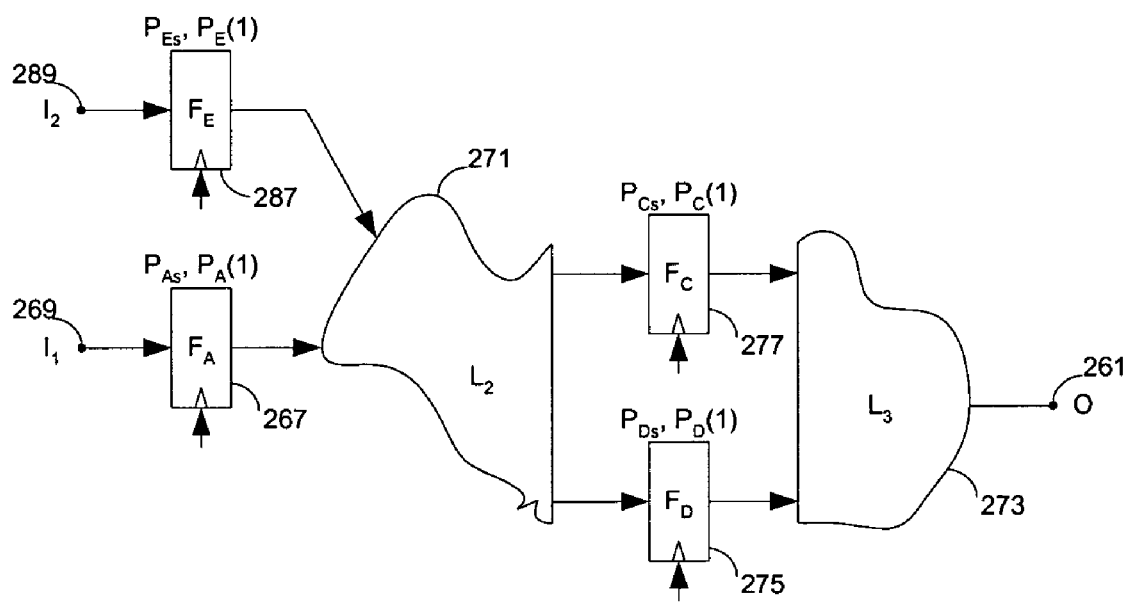

FIGS. 7 and 8 illustrate an example of propagating statistical data after a retiming operation during logic synthesis according to one embodiment of the present invention. In FIG. 7, registers 267 and 287 drive logic block $L_1$ (265), which drives register 263. After a retiming operation, register 263 is repositioned inside logic block 265 to generate circuit in FIG. 8. In FIG. 8, logic blocks $L_2$ (271) and $L_3$ (273) correspond to logic block $L_1$ (265 in FIG. 7). Registers 275 and 277 are on the paths between logic blocks 271 and 273. Since logic block $L_3$ (273) combines the signals from registers 275 and 277 to generate the signal for node 261, in general, the signal states of registers 275 and 277 cannot be determined from the state of node 261. Thus, it is in general difficult to determine the statistic data for registers 275 and 277 from the statistic data of registers 263, which corresponds to the statistic data of node 261. However, the states of registers 275 and 277 can be readily determined from the states of registers 267 and 287 and the function of logic block $L_2$ (271). Thus, the statistic data of circuit activities for registers 275 and 277 can be determined (propagated) from the statistics maintained at registers 267 and 287. Note the statistical data of register 263 before the transformation may be discarded. Alternatively, the statistical data of register 263 can then be maintained at node 261.

Similarly, if a register is moved forward in a retiming operation, the statistical data for the new registers are determined from the upstream statistical data; and, the statistical data for the original register may be discarded or maintained at a newly selected nearby node.

Some circuits contain loops. Statistical data for circuit activities for a loop can be maintained at one or more nodes on the loop so that the activity statistics for the rest of the loop can be determined from the statistical data on these nodes and from Boolean analyses. In general, it is not necessary to maintain the statistical data at all the sequential elements. The statistical data for some sequential elements can be easily determined from other statistical data and related logic functions. Certain logic elements (e.g., a multiplier) may involve complex operations so that the statistics of output of such a complex logic element may be maintained at a node, regardless whether the output is registered.

The statistical data are typically propagated forward in the direction of signal propagation in the signal paths in the circuit. However, in certain cases, the signal state at an upstream point in a signal path may also be uniquely determined from the signal state at a downstream point in the signal path, in which case the statistical data may be propagated backward.

In one embodiment of the present invention, correlation information is derived from the fanin or fanout logic. For example, information derived from the logic feeding a fanin register are used to correlate nodes driving the register; and, information derived from the logic from a fanout register are used to correlate nodes driven by the fanout register.

Figure 9:
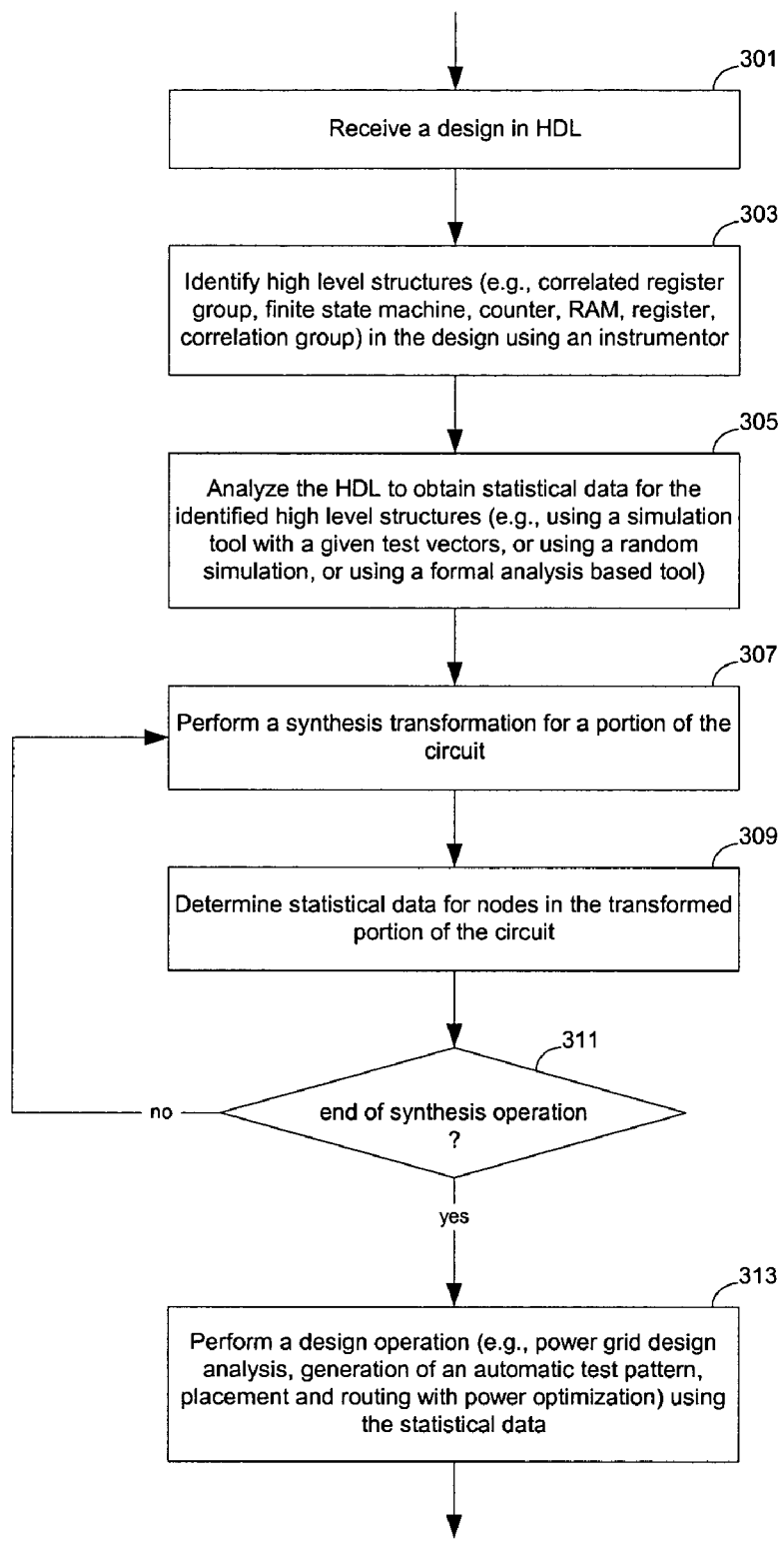
FIG. 9 shows a method to obtain statistical circuit activity data for a gate level design from a register transfer level (RTL) statistical analysis according to one embodiment of the present invention.

FIG. 9 shows a method to obtain statistical circuit activity data for a gate level design from a register transfer level (RTL) statistical analysis according to one embodiment of the present invention. After operation 301 receives a design in a Hardware Description Language (HDL), operation 303 identifies high level structures (e.g., correlated register group, finite state machine, counter, RAM, register, correlation group) in the design using an instrumentor. Various methods used in the art for identifying high level structures (e.g., which may have been used for the purpose of equivalence checking) can be used. Operation 305 analyzes the HDL to obtain statistical data for the identified high level structures (e.g., using a simulation tool with a given test vectors, or using a random simulation, or using a formal analysis based tool). After operation 307 performs a synthesis transformation for a portion of the circuit, operation 309 determines statistical data for nodes in the transformed portion of the circuit. The statistical data may include the correlation information for groups of nodes that will be used to determine the statistical data of other nodes in the circuit (e.g., in terms of the probabilities of a group being in various states). Operations 307 and 309 are repeated until the end of the synthesis operation, after which operation 313 performs a design operation (e.g., power grid design analysis, generation of an automatic test pattern, placement and routing with power optimization) using the statistical data. The statistical data maintained on the nodes of the circuit during the synthesis operation can be propagated to other nodes in the circuit. Note that in general the set of nodes used for maintaining the statistical data is not fixed. The nodes used for maintaining the statistical data evolves during the process of synthesis transformations; and, the statistical data determined at one node after one transformation may be used to determine the statistical data at another node after another transformation.

Figure 10:
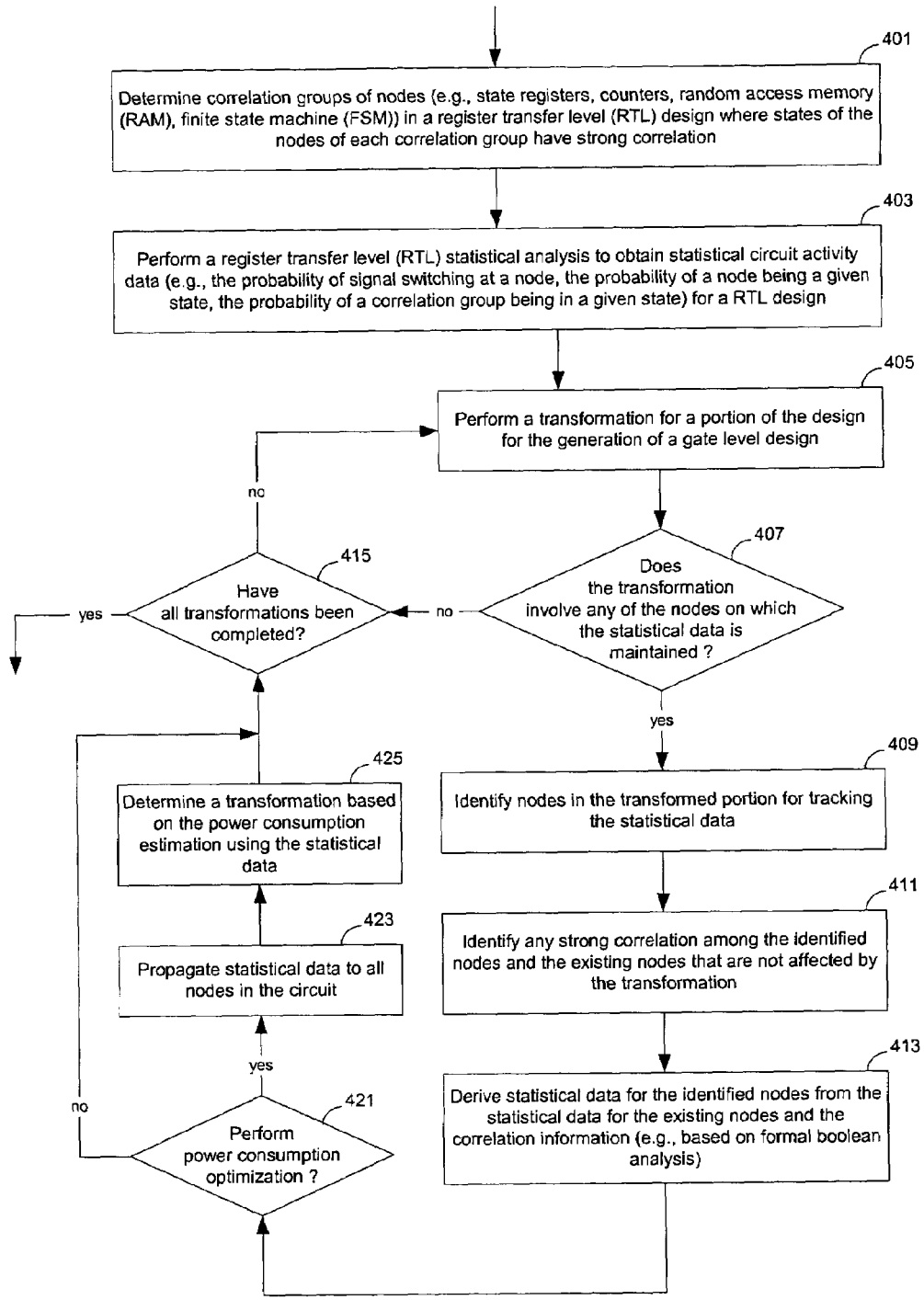
FIG. 10 shows a detailed method to maintain and propagate statistical circuit activity data during circuit design transformations according to one embodiment of the present invention.

FIG. 10 shows a detailed method to maintain and propagate statistical circuit activity data during circuit design transformations according to one embodiment of the present invention. Operation 401 determines correlation groups of nodes (e.g., state registers, counters, random access memory (RAM), finite state machine (FSM)) in a register transfer level (RTL) design where states of the nodes of each correlation group have strong correlation. Operation 403 performs a register transfer level (RTL) statistical analysis to obtain statistical circuit activity data (e.g., the probability of signal switching at a node, the probability of a node being a given state, the probability of a correlation group being in a given state) for a RTL design. Statistical data for circuit activity is maintained for the correlation groups. For example, the probability of a group being in each state is maintained to track the correlation between nodes. After operation 405 performs a transformation for a portion of the design for the generation of a gate level design, operation 407 determines whether the transformation involve any of the nodes on which the statistical data is maintained. When a node is involved in the transformation, operation 409 identifies nodes in the transformed portion for tracking the statistical data. Operation 411 identifies any strong correlation among the identified nodes and the existing nodes that are not affected by the transformation. Note that, alternatively, new nodes can be identified for tracking the statistical data even when no existing nodes are involved in the transformation. Operation 413 derives statistical data for the identified nodes from the statistical data for the existing nodes and the correlation information (e.g., based on formal Boolean analysis). When a Boolean analysis is used, the achievable states of a correlation group constrain the scope of the Boolean analysis, which may determine all the possible states of a portion of the circuit for the determination of the statistical circuit activity in the portion of the circuit. Operation 421 determines whether to perform power consumption optimization. To perform power consumption optimization, operation 423 propagates statistical data to all nodes in the circuit from the nodes where the statistical data and corresponding correlation information is maintained; and, operation 425 determines a transformation based on the power consumption estimation using the statistical data. Operation 405 is repeated unless operation 415 determines that all transformations have been completed. Note that power consumption may be optimized based on a block (or a portion) of the circuit, in which case the statistical data is propagated in the block (or the portion) where the power consumption estimation is needed.

Although many examples are illustrated with logical synthesis, from this description, it will be apparent to one skilled in the art that the methods of the present invention can also be used during a behavioral synthesis or other types of synthesis transformations. For example, a behavioral description of a system may use floating point variables. The probability distribution of the values of a floating point variable can be obtained from a simulation at the behavioral level design. During the behavioral synthesis, this floating point variable may be transformed into a fixed point variable. Thus, the probability of this variable being in a given state as a fixed point representation is computed from the original probability distribution for the floating point representation during the behavioral synthesis according to one embodiment of the present invention.

Although some examples are illustrated with precision probability information and computation, it is understood that approximations of probability distributions can also be used to reduce the amount of information that needs to be maintained. For example, information about some weak correlations between a number of nodes may be discarded so that the states of these nodes are approximated as independent variables. This provides a way to perform tradeoff between the amount of information and the accuracy of information.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to design a circuit, the method comprising:
   determining first statistical circuit activity data at a plurality of nodes of a first design of the circuit, and wherein a subset of nodes of the plurality of nodes of the first design remain unchanged in the second design after the first portion of the first design is transformed;
   a portion of the first statistical circuit activity data is maintained for the subset of nodes in the second design;
   transforming a first portion of the first design to generate a second portion of a second design of the circuit;
   selectively determining at least one node in the second portion of the second design; and
   determining second statistical circuit activity data for the at least one node in the second portion of the second design from the first statistical circuit activity data.

2. A method as in claim 1, wherein the first portion of the first design includes at least one of the plurality of the nodes of the first design.

3. A method as in claim 1, wherein the second statistical circuit activity data comprises:
   a) probability information of state transition at a node;
   b) probability information of the node being at a state; and
   c) probability information of a group of nodes being at a state.

4. A method as in claim 1, further comprising:
   transforming a third portion of the second design to generate a fourth portion of a third design of the circuit;
   selectively determining at least one node in the fourth portion of the third design; and
   determining third statistical circuit activity data for the at least one node in the fourth portion of the third design from a portion of:
   a) the first statistical circuit activity data; and
   b) the second statistical circuit activity data.

5. A method as in claim 4, wherein one or more signals at the at least one node in the second portion of the second design drive the third portion of the second design.

6. A method as in claim 1, wherein the second statistical circuit activity data is determined from a formal Boolean analysis.

7. A method as in claim 1, wherein the first design is one of: a) a register transfer level (RTL) design, and b) a behavioral level design; and, the first portion of the first design is transformed to generate a gate level design.

8. A method as in claim 1, further comprising:
   selectively determining the plurality of nodes of the first design.

9. A method as in claim 8, wherein the first statistical circuit activity data is obtained from a statistical analysis based on the first design.

10. A method as in claim 9, wherein the statistical analysis comprises one of:
    a) a simulation based on a set of test vectors;
    b) a simulation based on random input;
    c) a formal analysis based on a specification of statistical input data.

11. A method as in claim 8, wherein the plurality of nodes comprise at least one of:
    a) a register;
    b) a finite state machine;
    c) a counter;
    d) a random access memory (RAM);
    e) a set of registers with state constraints; and
    f) a persistent node.

12. A method as in claim 8, further comprising:
    determining state correlation information among the plurality of nodes of the first design;
    wherein the second statistical circuit activity data is further determined from the state correlation information.

13. A method as in claim 1, wherein said transforming comprises one of:
    a) replicating a register;
    b) pushing a register through a logic element;
    c) changing encoding of a finite state machine;
    d) retiming; and
    e) changing encoding of a group of nodes.

14. A method as in claim 13, wherein at least one node in the second portion of the second design comprises a register of the second portion of the second design.

15. A method as in claim 1, further comprising:
    determining state correlation information among the at least one node in the second portion of the second design and a subset of nodes of the plurality of nodes of the first design that remain unchanged in the second design after the first portion of the first design is transformed.

16. A machine readable medium containing executable computer program instructions which when executed by a digital processing system cause said system to perform a method to design a circuit, the method comprising:
    determining first statistical circuit activity data at a plurality of nodes of a first design of the circuit, and wherein a subset of nodes of the plurality of nodes of the first design remain unchanged in the second design after the first portion of the first design is transformed;
    a portion of the first statistical circuit activity data is maintained for the subset of nodes in the second design;
    transforming a first portion of the first design to generate a second portion of a second design of the circuit;
    selectively determining at least one node in the second portion of the second design; and
    determining second statistical circuit activity data for the at least one node in the second portion of the second design from the first statistical circuit activity data.

17. A medium as in claim 16, wherein the first portion of the first design includes at least one of the plurality of the nodes of the first design.

18. A medium as in claim 16, wherein the second statistical circuit activity data comprises:
    a) probability information of state transition at a node;
    b) probability information of the node being at a state; and
    c) probability information of a group of nodes being at a state.

19. A medium as in claim 17, wherein the method further comprises:
  transforming a third portion of the second design to generate a fourth portion of a third design of the circuit;
  selectively determining at least one node in the fourth portion of the third design; and
  determining third statistical circuit activity data for the at least one node in the fourth portion of the third design from a portion of:
  a) the first statistical circuit activity data; and
  b) the second statistical circuit activity data.

20. A medium as in claim 19, wherein one or more signals at the at least one node in the second portion of the second design drive the third portion of the second design.

21. A medium as in claim 16, wherein the second statistical circuit activity data is determined from a formal Boolean analysis.

22. A medium as in claim 16, wherein the first design is one of: a) a register transfer level (RTL) design, and b) a behavioral level design; and, the first portion of the first design is transformed to generate a gate level design.

23. A medium as in claim 16, wherein the method further comprises:
  selectively determining the plurality of nodes of the first design.

24. A medium as in claim 23, wherein the first statistical circuit activity data is obtained from a statistical analysis based on the first design.

25. A medium as in claim 24, wherein the statistical analysis comprises one of:
  a) a simulation based on a set of test vectors;
  b) a simulation based on random input;
  c) a formal analysis based on a specification of statistical input data.

26. A medium as in claim 23, wherein the plurality of nodes comprise at least one of:
  a) a register;
  b) a finite state machine;
  c) a counter;
  d) a random access memory (RAM);
  e) a set of registers with state constraints; and
  f) a persistent node.

27. A medium as in claim 23, wherein the method further comprises:
  determining state correlation information among the plurality of nodes of the first design;
  wherein the second statistical circuit activity data is further determined from the state correlation information.

28. A medium as in claim 16, wherein said transforming comprises one of:
  a) replicating a register;
  b) pushing a register through a logic element;
  c) changing encoding of a finite state machine;
  d) retiming; and
  e) changing encoding of a group of nodes.

29. A medium as in claim 28, wherein at least one node in the second portion of the second design comprises a register of the second portion of the second design.

30. A medium as in claim 16, wherein the method further comprises:
  determining state correlation information among the at least one node in the second portion of the second design and a subset of nodes of the plurality of nodes of the first design that remain unchanged in the second design after the first portion of the first design is transformed.

31. A data processing system to design a circuit, the data processing system comprising:
  means for determining first statistical circuit activity data at a plurality of nodes of a first design of the circuit, and wherein a subset of nodes of the plurality of nodes of the first design remain unchanged in the second design after the first portion of the first design is transformed; means for a portion of the first statistical circuit activity data is maintained for the subset of nodes in the second design;
  means for transforming a first portion of the first design to generate a second portion of a second design of the circuit;
  means for selectively determining at least one node in the second portion of the second design; and
  means for determining second statistical circuit activity data for the at least one node in the second portion of the second design from the first statistical circuit activity data.

32. A data processing system as in claim 31, wherein the first portion of the first design includes at least one of the plurality of the nodes of the first design.

33. A data processing system as in claim 31, wherein the second statistical circuit activity data comprises:
  a) probability information of state transition at a node;
  b) probability information of the node being at a state; and
  c) probability information of a group of nodes being at a state.

34. A data processing system as in claim 33, further comprising:
  means for transforming a third portion of the second design to generate a fourth portion of a third design of the circuit;
  means for selectively determining at least one node in the fourth portion of the third design; and
  means for determining third statistical circuit activity data for the at least one node in the fourth portion of the third design from a portion of:
  a) the first statistical circuit activity data; and
  b) the second statistical circuit activity data.

35. A data processing system as in claim 34, wherein one or more signals at the at least one node in the second portion of the second design drive the third portion of the second design.

36. A data processing system as in claim 31, wherein the second statistical circuit activity data is determined from a formal Boolean analysis.

37. A data processing system as in claim 31, wherein the first design is one of: a) a register transfer level (RTL) design, and b) a behavioral level design; and, the first portion of the first design is transformed to generate a gate level design.

38. A data processing system as in claim 31, further comprising:
  means for selectively determining the plurality of nodes of the first design.

39. A data processing system as in claim 38, wherein the first statistical circuit activity data is obtained from a statistical analysis based on the first design.

40. A data processing system as in claim 39, wherein the statistical analysis comprises one of:
  a) a simulation based on a set of test vectors;
  b) a simulation based on random input;
  c) a formal analysis based on a specification of statistical input data.

41. A data processing system as in claim 38, wherein the plurality of nodes comprise at least one of:

a) a register;
b) a finite state machine;
c) a counter;
d) a random access memory (RAM);
e) a set of registers with state constraints; and
f) a persistent node.

42. A data processing system as in claim 38, further comprising:
   means for determining state correlation information among the plurality of nodes of the first design;
   wherein the second statistical circuit activity data is further determined from the state correlation information.

43. A data processing system as in claim 31, wherein said means for transforming comprises one of:
   a) means for replicating a register;
   b) means for pushing a register through a logic element;
   c) means for changing encoding of a finite state machine;
   d) means for retiming; and
   e) means for changing encoding of a group of nodes.

44. A data processing system as in claim 43, wherein at least one node in the second portion of the second design comprises a register of the second portion of the second design.

45. A data processing system as in claim 31, further comprising:
   means for determining state correlation information among the at least one node in the second portion of the second design and a subset of nodes of the plurality of nodes of the first design that remain unchanged in the second design after the first portion of the first design is transformed.

* * * * *